(12) United States Patent
Stewart

(10) Patent No.: US 11,737,213 B2
(45) Date of Patent: *Aug. 22, 2023

(54) CARD EDGE CONNECTOR WITH INTRA-PAIR COUPLING

(71) Applicant: Micron Technology, Inc., Boise, ID (US)

(72) Inventor: Daniel B. Stewart, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/887,139

(22) Filed: Aug. 12, 2022

(65) Prior Publication Data

US 2022/0386462 A1 Dec. 1, 2022

Related U.S. Application Data

(63) Continuation of application No. 16/921,768, filed on Jul. 6, 2020, now Pat. No. 11,425,816.

(51) Int. Cl.
*H05K 1/11* (2006.01)

(52) U.S. Cl.
CPC ... *H05K 1/117* (2013.01); *H05K 2201/10189* (2013.01)

(58) Field of Classification Search
CPC .............. H05K 1/117; H05K 2201/10189
USPC ........................................... 361/760
See application file for complete search history.

(56) References Cited

U.S. PATENT DOCUMENTS

| | | | |
|---|---|---|---|
| 7,501,839 B2 * | 3/2009 | Chan | G01R 1/0735 324/762.01 |
| 2018/0098415 A1 * | 4/2018 | Lin | H05K 3/306 |
| 2019/0044259 A1 | 2/2019 | Khan et al. | |
| 2019/0141829 A1 | 5/2019 | Takken et al. | |
| 2022/0007508 A1 | 1/2022 | Stewart | |

* cited by examiner

*Primary Examiner* — Andargie M Aychillhum
(74) *Attorney, Agent, or Firm* — Perkins Coie LLP

(57) ABSTRACT

Systems, apparatuses, and methods related to a printed circuit board (PCB) with a plurality of layers are described. An edge connector may be formed on an end of the PCB substrate and may include contact pins on an outer layer of the plurality of layers. The edge connector may also include an intra-pair coupling block disposed on one or more interior layers such that at least a portion of the intra-pair coupling block is colinear with at least one contact pin on the outer layer. The electronic device may also include at least one integrated circuit on the PCB and electrically connected to the contact pins. The intra-pair coupling component may induce coupling of signals carried by the contact pins.

20 Claims, 4 Drawing Sheets

CARD EDGE CONNECTOR WITH INTRA-PAIR COUPLING

CROSS-REFERENCE TO RELATED APPLICATION(S)

This application is a continuation of U.S. patent application Ser. No. 16/921,768, filed Jul. 6, 2020, which is incorporated herein by reference in its entirety.

TECHNICAL FIELD

This disclosure relates generally to printed circuit boards, and more particularly, to printed circuit boards with card edge connectors configured to increase intra-pair coupling of signals.

BACKGROUND

Electronic and computer systems widely use connector assemblies for directly connecting one printed circuit board (PCB) of an electronic device to the PCB of another electronic device to couple the two devices (e.g., electronically and/or physically). For example, a daughter board of an electronic module can be directly connected to a motherboard of a host system without using cabling. A typical connector assembly can include an edge connector on the PCB of the electronic module and a socket on the motherboard of a host system that are configured to be coupled in a mating arrangement. Along with the PCB, including the edge connector, the electronic module can include integrated circuits thereon.

DETAILED DESCRIPTION

Figure 1:
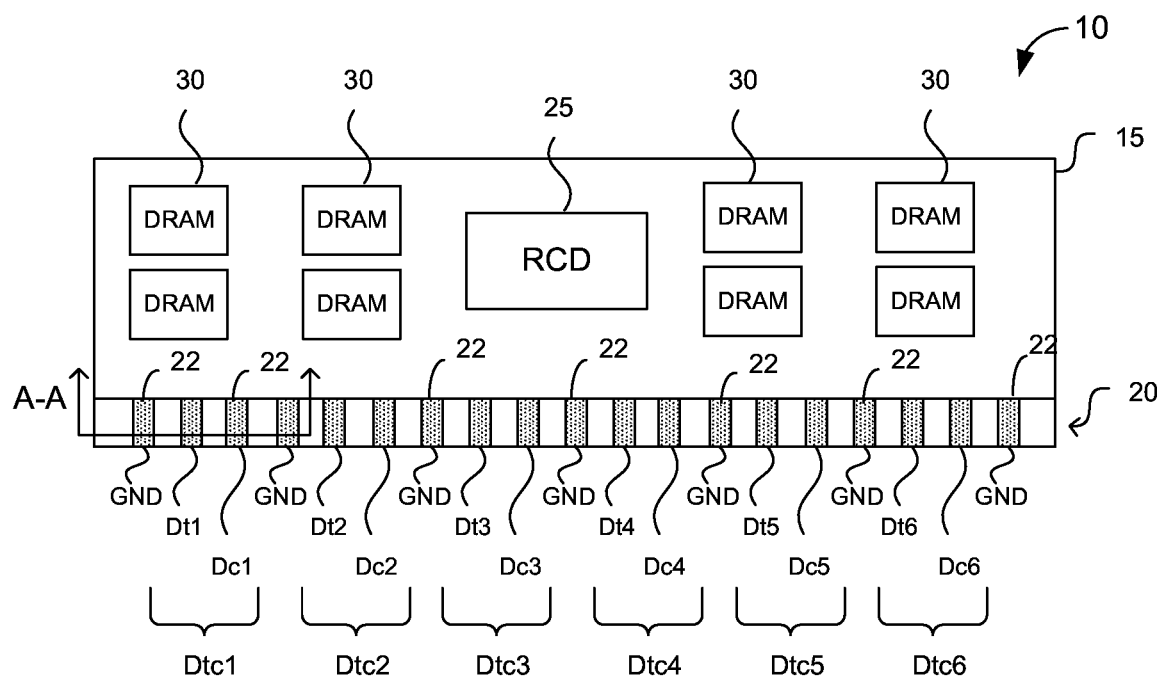
FIG. 1 illustrates a simplified block diagram of a front view of an electronic device with an edge connector that is configured as a memory module in accordance with one embodiment of the present disclosure.

One advantage of PCBs with edge connector assemblies is the ease of inserting and removing the electronic module from the host system. A typical electronic module can be a memory module with one or more memory devices. The memory devices can include volatile and non-volatile memory. Volatile memory, including random-access memory (RAM), static random-access memory (SRAM), dynamic random-access memory (DRAM), and synchronous dynamic random-access memory (SDRAM), among others, may require a source of applied power to maintain its data. Non-volatile memory, by contrast, can retain its stored data even when not externally powered. Non-volatile memory is available in a wide variety of technologies, including flash memory (e.g., NAND and NOR) phase change memory (PCM), ferroelectric random-access memory (FeRAM), resistive random-access memory (RRAM), and magnetic random-access memory (MRAM), among others. The memory module can be incorporated into a package such as a dual in-line memory module (DIMM). The memory module can also include a controller such as, for example, a Register Clock Driver (RCD) that connects to the host processor using a high-speed differential serial link interface to form a differential DIMM (DDIMM). The DDIMM enables host systems to increase memory capacities by attaching DRAM through serial links with much lower pin counts than traditional parallel DDR interfaces.

The PCB of the electronic module (e.g., a DDIMM) is typically configured as a rigid substrate and can be fabricated to include multiple conductive layers. The electronic module can have one or more integrated circuits (e.g., memory chips) thereon and an edge connector. The edge connector can include one or more electrically conductive pins (also referred to herein as "contact pins") along one or more edges of the electronic module. Each contact pin on the edge connector can respectively engage with a corresponding contact (e.g., a metal spring contact) in the socket. The edge connector and socket contacts provide one or more electrical connections between the electronic module (e.g., memory module) and a receiving motherboard (e.g., a motherboard of a host system).

The edge connector/socket contacts provide for digital signals to be transmitted between the memory module and the host system. The digital signals can include high-speed single-ended signals and/or high-speed differential signal pairs. A differential signal pair is designated herein as Dtc, and each Dtc signal can include a data bit true signal (Dt) and a data bit compliment signal (Dc). To isolate the digital signals from adjacent digital signals, one or more contact pins can be connected to ground. For example, the layout of the contact pins (e.g., signal and ground pins) on each side of a typical edge connector for Dtc signals is: [GND] [Dt1] [Dc1] [GND] [Dt2] Dc2] . . . [GND] [Dtn] Dcn]. Accordingly, approximately 30% of the pins on the portion of the edge connector with the differential signal pairs Dtc are ground pins. However, maintaining signal integrity of the high-speed differential signals (and/or high-speed single-ended signals) can be challenging due at least in part to a resonance associated with the connection region. The resonance can be due to single-ended or common mode coupling between the high-speed signal to ground (e.g., in the case of a Dtc signal, a coupling between one or both of the differential pair signals Dt, Dc to ground can occur). This is because the width of the contact pin of the edge connector can be wider than a trace width of the corresponding signal trace. With a wider contact pin, common-mode coupling can occur between the signal and ground. The resonance can create insertion loss notch that appears between 2 GHz and 20 GHz depending on the type of memory module. Some DDIMMs mitigate the single-ended coupling by including a void area (no conductive material) in the layer or layers under the contact pins of the edge connector. However, the layers under the contact pin cannot be completely voided because a ground trace (or traces) is needed in one or more of the interior layers of the edge connector to provide isolation between signals (e.g., isolation between Dtc signals) that are disposed on opposing sides (e.g., front and back) of the edge connector. Further, in some systems, to mitigate the resonance, DDRx memory modules can include conductive flags on select layer to layer vias to adjust the signal integrity. However, further reductions in resonance can be achieved.

In an exemplary embodiment, an electronic device includes a printed circuit board having a substrate with a plurality of layers. The PCB includes an edge connector formed on an end of the substrate. The edge connector includes a first contact pin disposed on an outer layer of the plurality of layers and a second contact pin disposed adjacent the first contact pin on the outer layer. The edge connector also includes an intra-pair coupling component (also referred to herein as "intra-pair coupling block") disposed on one or more interior layers of the plurality of layers such that at least a portion of the intra-pair coupling component is colinear with at least one of the first contact pin or the second contact pin. The electronic device also includes at least one integrated circuit disposed on the PCB and electrically connected to the first and second contact pins. The intra-pair coupling component is configured to induce coupling of signals carried by the first and second contact pins. In another exemplary embodiment, a method of performing intra-pair coupling includes forming a first contact pin on an outer layer of a multi-layer printed circuit board and forming a second contact pin on the outer layer adjacent the first contact layer. The method also includes forming an intra-pair coupling component on one or more interior layers of the multi-layer printed circuit board and aligning the intra-pair coupling component such that at least a portion of the intra-pair coupling component is colinear with the first and second contact pins.

Specific details of several embodiments of an edge connector of an electronic device are described herein with reference to the appended figures. For clarity, the exemplary electronic devices in this description are memory modules. However, the exemplary embodiments of the present disclosure are not limited to memory modules and the inventive concepts can be used in other type of electronic devices (e.g., computer peripheral cards such as for example, graphic cards, sound cards, etc.). In addition, descriptions of exemplary embodiments are given with respect to differential signal pairs Dtc. However, those skilled in the art will understand that exemplary embodiments of the present invention can be implemented with appropriate single-ended digital signals.

FIG. 1 illustrates a simplified block diagram of an electronic device that is configured as a memory module 10. The memory module 10 can be a DIMM or SIMM. The memory module 10 includes a printed circuit board 15. The memory module 10 can include an RCD 25 and one or more DRAM chips 30 mounted on the PCB 15. Of course, the memory module can additionally (or alternatively) include other types of memory chips as discussed above. In some embodiments, the PCB 15 can include an edge connector 20. The edge connector 20 can include multiple contact pins 22 (see shaded regions—for clarity only a few are labeled). The contact pins 22 of the edge connector 20 provide for an electrical interface between the memory module 10 and an external component such as, for example, a host computer. The PCB 15 can include trace lines that carry signals (e.g., data, command, address, etc.) and/or provide ground connections between the contact pins 22 and the appropriate integrated circuits of the memory module 10 (for clarity, the figures do not include the signal trace lines).

In some exemplary embodiments, the signals transmitted from and/or received by the memory module 10 can include one or more differential signal pairs Dtc that have a true signal Dt and a complementary signal Dc. The Dtc signals can be connected to the contact pins 22 of the edge connector 20 in order to facilitate communications between the memory module 10 and external components such as, for example, a host computer. As seen in FIG. 1, the exemplary memory module 10 can include six differential signal pairs Dtc1-6 on the front side of the memory module 10. Of course, the number of differential signal pairs is exemplary and other memory modules can have more than six or less than six differential signal pairs. If the memory module 10 is a DIMM, the contact pins on the back side of the memory module can also be configured to transmit/receive differential signal pairs. A ground trace GND can be disposed between each Dtc signal and/or at one or both ends of the edge connector 20 to isolate each Dtc signal from the other Dtc signals and/or the noise from other components. In addition, as best seen in FIGS. 2A and 2B, one or more ground traces (e.g., ground traces 40a, 40b) can be disposed longitudinally along the edge connector 20 on one or more interior layers to isolate the Dtc signals (or other signals) one side of the edge connector 20 (e.g., front side of a DIMM) from the Dtc signals (or other signals) on the other side of the edge connector 20 (e.g., back side of the DIMM).

However, when coupled to a socket, a common mode coupling can exist between the ground(s) and the differential signal pairs Dtc that can cause resonance and an insertion loss notch that can appear between 2 GHz to 20 GHz at the card edge interface, depending on the type of memory module. To decrease the common mode coupling, some systems include one or more void layers (e.g., layers made of a material that is not electrically conductive) between the contact pins 22 carrying the Dtc signals and the longitudinal ground traces (e.g., ground trace 40a and/or 40b). Despite these void layers, the coupling between ground and the differential signal pairs Dtc (e.g., Dtc1-6) can still be a problem with respect to insertion loss notch and signal integrity.

In exemplary embodiments of the present disclosure, the memory module 10 includes an intra-pair coupling component to increase the coupling between the differential signal pairs Dtc. By appropriately tuning the coupling between the differential signal pairs Dtc (also referred to herein as "intra-pair coupling"), the common mode coupling to ground can be decreased and the signal integrity on the differential signal pair Dtc can be increased. In some exemplary embodiments, intra-pair coupling can be achieved by adding one or more traces (referred to herein as a "coupling trace") from the contact pin corresponding to a signal (Dt or Dc) of a differential signal pair Dtc to a location under the contact pin corresponding to the other signal (Dc or Dt) of the differential signal pair Dtc. For example, FIGS. 2A and 2B illustrate exemplary embodiments of an edge connector with an intra-pair coupling component.

Figure 2A:
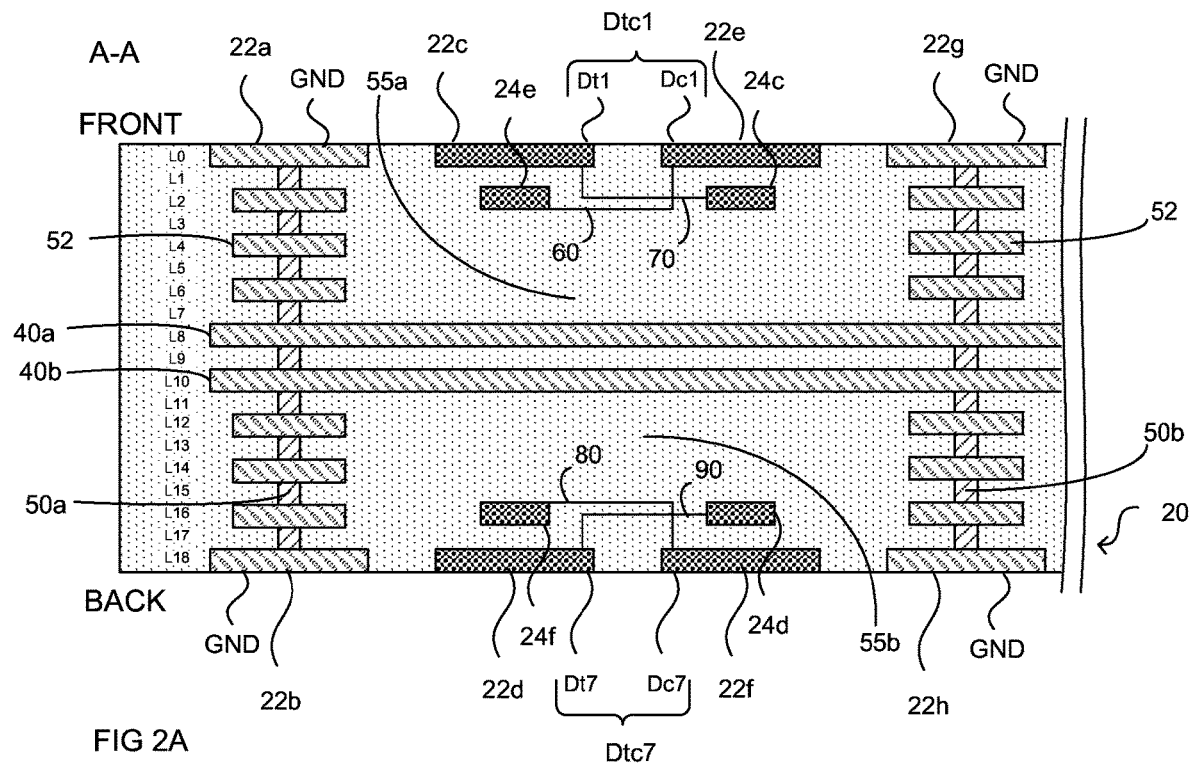
FIGS. 2A and 2B illustrate a bottom cross-sectional view of exemplary embodiments of edge connector configurations that are consistent with exemplary embodiments of the present disclosure.
Figure 2B:
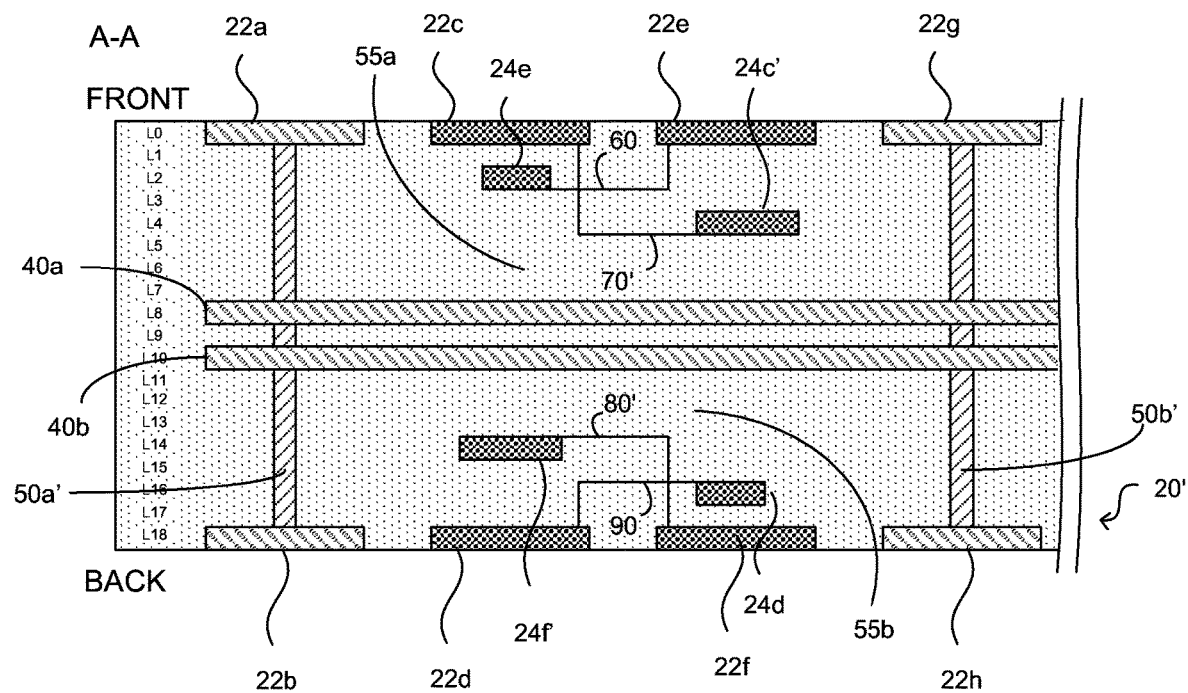

FIG. 2A illustrates a bottom cross-section view of a portion of the edge connector 20 corresponding to section A-A of FIG. 1. As seen in FIG. 2A, the edge connector 20 is part of a DDIMM that has differential signal pairs Dtc1 and Dtc7 which are transmitted from and/or received by the memory module 10 using contact pins arranged on opposing sides (e.g., front and back) of the edge connector 20. For example, the differential signal pair Dtc1 can be carried over contact pins 22c and 22e, which can be on a front side of the memory module 10, and the differential signal pair Dtc7 can be carried over contact pins 22d and 22f, which can be on a back side of the memory module 10. The substrate of the PCB 15 at the edge connector 20 can be composed of multiple layers. For example, in the exemplary embodiment of FIG. 2A, the edge connector 20 can include layers L0 to L18 with L0 being the outer front layer, L18 being the outer back layer, and layers L1 to L17 being interior layers. Each layer can consist of any combination of electrically non-conductive (e.g., insulating) materials and electrically conductive materials formed (e.g., deposited) thereon. In the exemplary embodiment, the odd layers L1, L3, L5, L7, L9, L11, L13, L15, and L17 can be electrically insulating layers (except for the vias as discussed below) and the even layers L0, L2, L4, L6, L8, L10, L12, L14, L16, and L18 can have a combination of conductive materials and non-conductive materials formed thereon, as discussed further below. However, the fabrication of each layer is not limiting to that disclosed and other electrically conductive/non-conductive patterns can be used so long as intra-pair coupling is achieved, as discussed below. Fabrication and formation of a PCB substrate with multiple layers is known in the art and thus will not be further discussed herein.

As seen in FIG. 2A, contact pins 22a,c,e,g can be disposed on the outer layer L0 and contact pins 22b,d,f,h can be disposed on the outer layer L18. The edge connector 20 can also include one or more ground traces that extend longitudinally along interior layers of the edge connector 20. For example, in some embodiments, ground traces 40a, 40b can be formed on interior layers L8 and L10, respectively, and extend substantially the length of the edge connector 20 to isolate signals (e.g., Dtc1) on the front side of the edge connector 20 from the signals (e.g., Dtc7) on the back side of the edge connector 20.

In some embodiments, Dtc signals on the same side of the edge connector 20 can be isolated from each other using ground traces. For example, as seen in FIG. 2A, contact pins 22a and 22b can be electrically connected to each other using, for example, via 50a, and contact pins 22g and 22h can be electrically connected to each other using, for example, via 50b. One or more contact pins 22a,b,g,h can be electrically connected to each other and/or one or more of the contact pins 22a,b,g,h can be electrically connected to a ground trace (not shown) to isolate the differential signal pairs from each other and/or other signals on the memory module 10. For example, differential signal pair Dtc1 can be disposed between contact pins 22a and 22g to isolate Dtc1 from other signals on the same side of the edge connector 20, and differential signal pair Dtc7 can be disposed between contact pins 22b and 22h to isolate Dtc7 from other signals on the same side of the edge connector 20. Accordingly, along with ground traces 40a and 40b, the ground contacts 22a,b,g,h all serve to shield or isolate the signals on contact pins 22 of the edge connector 20 from each other. In some embodiments, the ground contact vias 50a and/or 50b can be part of a "picket fence-type" ground connection, and in other embodiments, the ground contact vias 50a and/or 50b can be stand-alone "pole-type" ground connections (see, e.g., FIG. 2B.). In picket fence-type ground connections, cross-wise traces 52 are formed, for example, perpendicular to the ground contact via 50a and/or 50b on one or more of the interior layers. As seen in FIG. 2A, in some embodiments, the cross-wise traces 52 do not extend the full length of the edge connector 20 and thus allowing for the formation of void areas in the edge connector 20 such as, for example, void areas 55a and/or 55b, which can be formed of electrically insulating materials to help limit the common mode coupling on signals Dtc1 and Dtc7, respectively. Pole-type ground connections (e.g., see ground contact vias 50a' and 50b' in FIG. 2B) can also allow for the formation of void areas, if needed. But because pole-type ground connections do not have the cross-wise traces 52, the shielding is not as effective as picket-type ground contact connections. However, picket fence-type ground contact connections can be more difficult to fabricate. Accordingly, depending on the amount of desired shielding, exemplary embodiments of the present disclosure can use either or both types of shielding to isolate the signals on the edge connector 20.

As discussed above, the ground traces 40a, 40b and/or the ground contact vias 50a, 50b can introduce common mode coupling (e.g., capacitance coupling) on the Dtc signals, which can adversely affect signal quality of the signals. To mitigate the adverse effects of the common mode coupling, one or more differential signal pairs Dtc can include intra-pair coupling. That is, the Dt signal is coupled to the Dc signal and/or Dc signal is coupled to the Dt signal. In some embodiments, the memory module 10 can include an intra-pair coupling component that couples one or both signals (Dt, Dc) to the other. The intra-pair coupling component can include one or more conductive regions (e.g., region(s) having electrically conductive material or materials) that are formed in the interior layers of the edge connector 20 and configured to intra-pair couple the differential signal pair. For example, in some embodiments, the intra-pair coupling component can include, for example, a coupling pad (e.g., a conductive region) disposed under the contact pin carrying the Dt signal and electrically connected to a contact pin carrying the Dc signal and/or a coupling pad (e.g., a conductive region) disposed under the contact pin carrying the Dc signal and electrically connected to a contact pin carrying the Dt signal.

As seen in FIG. 2A, coupling trace 60 can be routed from contact pin 22e carrying the Dc1 signal to a coupling pad 24e disposed on a lower level under contact pin 22c carrying the Dt1 signal. In addition, coupling trace 70 can be routed from contact pin 22c carrying signal Dt1 to a coupling pad 24c disposed on a lower level under contact pin 22e carrying signal Dc1. Similarly, coupling trace 80 can be routed from contact pin 22f carrying the Dc7 signal to a coupling pad 24f disposed on a lower level under contact pin 22d carrying signal Dt7, and coupling trace 90 can be routed from contact pin 22d carrying signal Dt7 to a coupling pad 24d disposed on a lower level under contact pin 22f carrying signal Dc7. In some embodiments, only one signal (Dt or Dc) of the differential signal pair Dtc is routed to a coupling pad under the contact pin for the other signal, but, in other embodiments (e.g., as shown in FIGS. 2A and 2B), both signals (Dt and Dc) of the differential signal pair Dtc are routed to the coupling pads under the appropriate contact pins.

The coupling pads corresponding to a differential signal pair Dtc (referred to herein as "corresponding coupling pads") can be formed on one or more of the interior layers L2 to L17. For example, the coupling pads 24c and 24e can be formed on one or more interior levels between the ground trace 40a on layer L8 and the outer layer L0. Similarly, the coupling pads 24d and 24f can be formed on one or more interior layers between the ground trace 40b on layer L10 and the outer layer L18. In some embodiments, the corresponding coupling pads (e.g., corresponding coupling pads 24c and 24e and/or corresponding coupling pads 24d and 24f) can be disposed on the same interior layer (or layers) of the edge connector 20. For example, in FIG. 2A, the corresponding coupling pads 24c and 24e are formed on layer L2 of the edge connector 20, and the corresponding coupling pads 24d and 24f are formed on layer L16 of the edge connector 20. In the embodiment of FIG. 2A, each of the coupling pads 24c, 24d, 24e, and 24f is formed on the closest applicable interior layer (e.g., L2 or L16) to the corresponding outer layer (e.g., L0 or L18), after taking into account the interposing insulating layer (e.g., L1 and L17). For clarity and brevity, the closest applicable interior layer after taking into account the interposing insulating layer is referred to herein as the adjacent layer. Thus, in the embodiment of FIG. 2A, corresponding coupling pads 24c and 24e are both formed on an adjacent layer to that of contact pins 22c and 22e, and corresponding coupling pads 24c and 24e are both formed an adjacent layer to that of contact pins 22d and 22f. However, depending on factors such as, for example, coupling strength and/or to facilitate the routing of the coupling traces, in other embodiments, the corresponding coupling pads can be formed on interior layers that are not an adjacent layer to that of the corresponding contact pins. For example, in the embodiments of FIG. 2A, the corresponding coupling pads 24c and 24e can be formed on any of the interior layers L3 to L7 and/or the corresponding coupling pads 24d and 24f can be formed on any of the interior layers L11 to L15.

In the embodiment of FIG. 2A, both pads of the corresponding coupling pads are formed on the same layer. However, depending on factors such as, for example, coupling strength and/or to facilitate the routing of the coupling traces, in other embodiments, the corresponding coupling pads can be formed on different interior layers. FIG. 2B illustrates an edge connector 20' that is similar in configuration to edge connector 20 but the ground contact vias 50a' and 50b' do not include cross-traces and corresponding coupling pads are not formed on the same interior layer. The differences in the ground connectors between edge connector 20 and 20' are discussed above and thus will not be further discussed here. With respect to the coupling pads, as seen in FIG. 2B, coupling pads 24e and 24d in edge connector 20' are configured similar to those of edge connector 20. However, unlike the configuration of edge connector 20, the coupling pad 24c' is formed on a different interior layer than that of coupling pad 24e, and the coupling pad 24f' is formed on a different interior layer than that of coupling pad 24d. By forming the corresponding coupling pads on different interior layers, greater flexibility can be achieved in routing the coupling traces and/or tuning signal integrity. In some embodiments, to account for the difference in the number of interior layers between the contact pins and coupling pads, the width of the coupling trace and/or the width of the coupling pad that is farther away from the contact pins is greater than the width of the coupling trace and/or coupling pad that is closer (e.g., see difference in widths of corresponding coupling pads 24e and 24c' and corresponding coupling pads 24d and 24f'). In the embodiment of FIG. 2B, coupling pads 24e, 24c', 24d, and 24f' are disposed on layers L2, L4, L16, and L14, respectively. However, each of the coupling pads can be disposed on other layers of the edge connector 20 so long the desired intra-pair coupling is achieved. Additional details of the routing of the coupling traces is provided below with respect to the embodiments of FIGS. 3A to 3C.

Figure 3A:
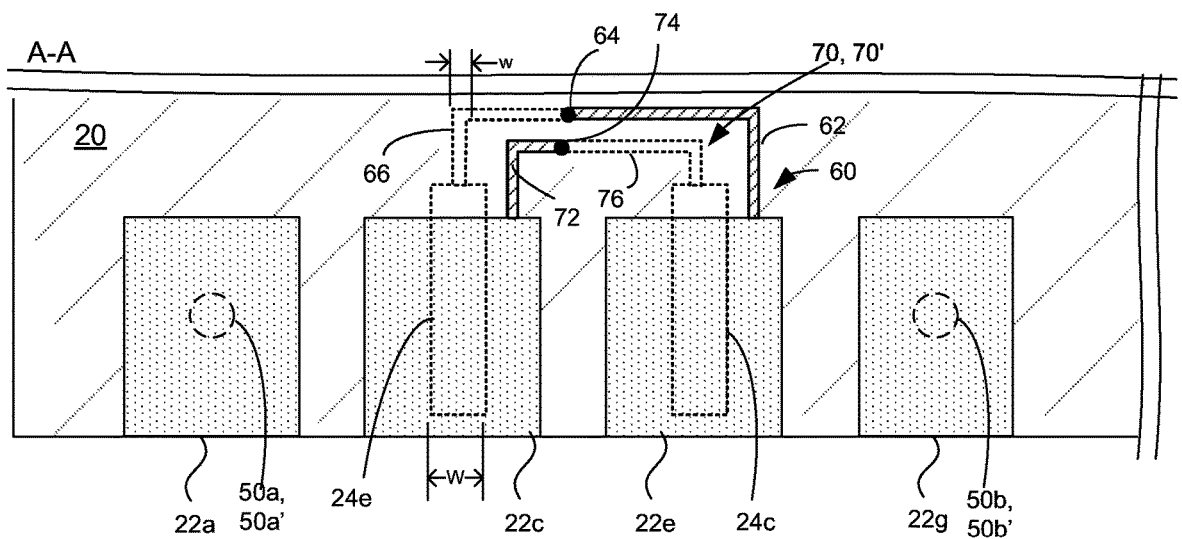
FIGS. 3A to 3C illustrate a portion of a front view of exemplary embodiments of edge connector configurations that are consistent with the present disclosure.
Figure 3B:
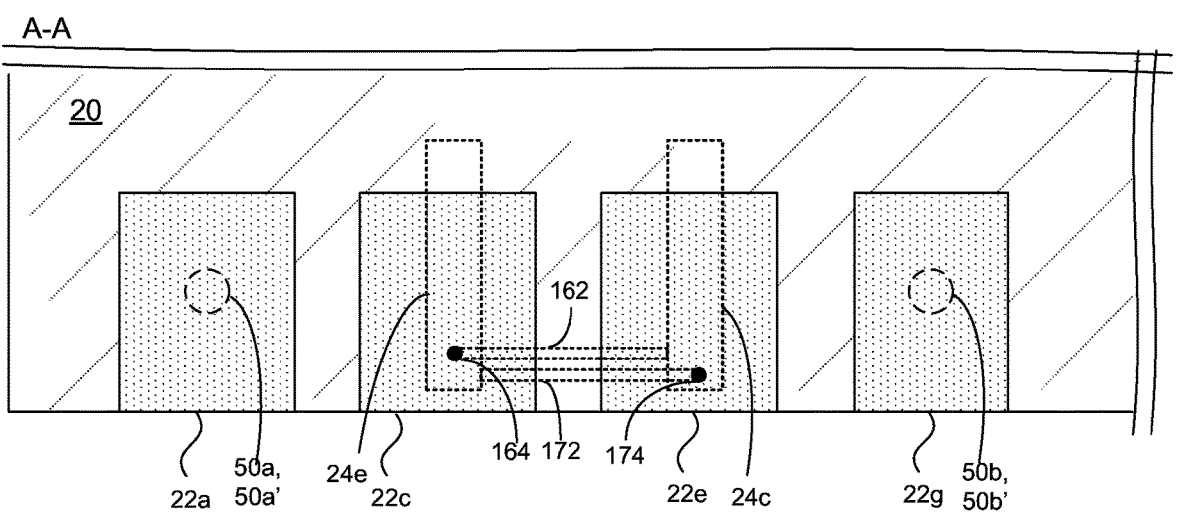
Figure 3C:
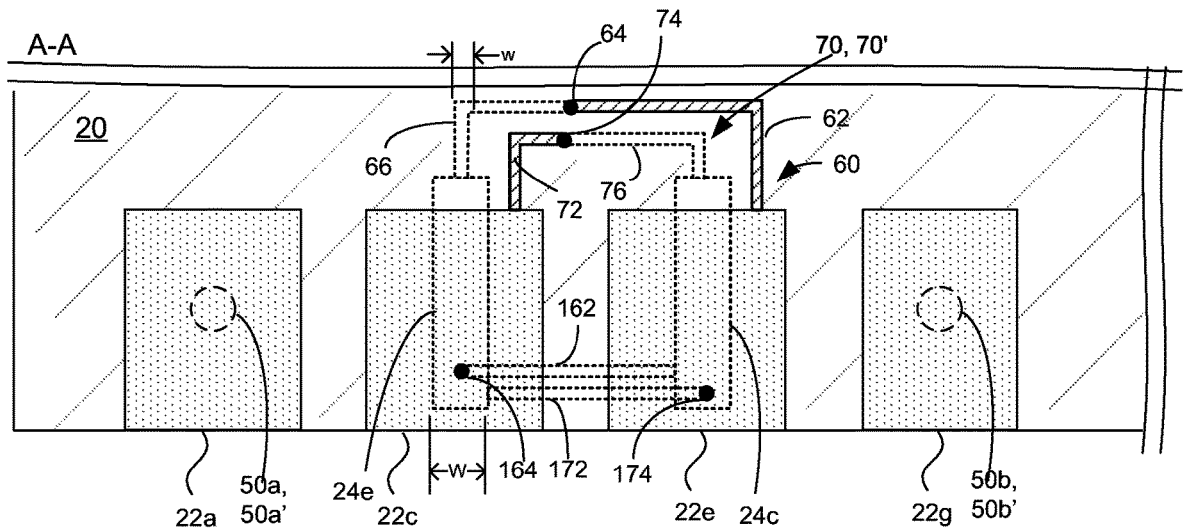

FIGS. 3A to 3C illustrate exemplary coupling trace configurations for intra-pair couplings that are consistent with the present disclosure. FIGS. 3A to 3C provide a front view of a portion of the memory module 10 that corresponds to section A-A and includes contact pins 22a, 22c, 22e, and 22g. Contacts pins 22a and 22g along with ground contact vias 50a, 50b (or 50a', 50b') make up part of the signal shielding configuration discussed above. The items with dotted outlines represent components disposed on an interior layer while the solid lines represent items disposed on an outer layer. In each of the FIGS. 3A to 3C, the edge connector 20 includes coupling trace configurations for the intra-pair coupling of differential signal pair Dtc1 on contact pins 22c and 22e. For example, as seen in FIG. 3A, an exemplary coupling trace configuration can include a coupling trace 60 disposed between contact pin 22e and coupling pad 24e and/or a coupling trace 70 (or 70') between contact pin 22c and coupling pad 24c. The coupling trace 60 can include an outer portion 62 that is coupled to the contact pin 22e, which can be formed on an outer layer as discussed above, and interior portion 66 that is coupled to the coupling pad 24e, which can be formed on one or more of the interior layers as discussed above. Similarly, the coupling trace 70 (or 70') can include an outer portion 72 that is coupled to the contact pin 22c, which can be formed on the outer layer, and interior portion 76 that is coupled to the coupling pad 24c, which can be formed on the same interior layer(s) as the interior portion 66 (or, for coupling trace 70', on a different interior layer(s) than interior portion 66), as discussed above. The shapes of the coupling traces are not limited to the shapes illustrated in FIGS. 3A to 3C (e.g., straight traces with sharp angles) and can be any desired shape (e.g., any combination of angled, straight, and curved shapes) that electrically connects the corresponding coupling pad and contact pin.

In the embodiment of FIG. 3A, the coupling traces 60 and 70 (or 70') have an inboard coupling trace configuration. That is, the routing of the coupling traces 60 and 70 (or 70') uses a pattern that is substantially inboard on the PCB 15 (e.g., away from the contact pins 22 toward the interior of the PCB 15). The outer portions 62 and 72 are connected to the respective interior portions 66 and 76 using inboard vias 64 and 74. One or both of the inboard vias 64 and 74 can be, for example, a blind via (or some other appropriate via). In some embodiments, each interior portion 66 and 76 and its corresponding coupling pad 24e and 24c, respectively, can be formed as a single component (e.g., as a single trace). In other embodiments, each interior portion 66 and 76 and its corresponding coupling pad 24e and 24c can be formed as separate components which are then connected. Similarly, each outer portion 62 and 72 and its corresponding contact pin 22e and 22c, respectively, can be formed as a single component (e.g., as a single trace), but in other embodiments, each outer portion 66 and 76 and its corresponding contact pin 22e and 22c, respectively, can be separate components that are connected.

In some embodiments, one or both coupling pads 24c and 24e can be disposed under contact pins 22e and 22c, respectively, to intra-pair couple the differential signal pair Dtc1. As seen in FIG. 3A, the coupling pad 24e can be formed on an interior layer(s) under the contact pin 22c such that at least a portion of the coupling pad 24e is colinear with the contact pin 22c. "Colinear" as used herein means being in-line with respect to an axis that is normal to the outer surface of the contact pin. Similarly, the coupling pad 24c can be formed on interior layer under the contact pin 22e such that at least a portion of the coupling pad 24c is colinear with the contact pin 22e with respect to an axis that is normal to the outer surface of the contact pin 22e.

FIG. 3B illustrates another embodiment of a coupling trace configuration. For brevity, the description of FIG. 3B focuses mainly on the differences from the embodiment of FIG. 3A. In the embodiment of FIG. 3B, the routing of the coupling traces uses a pattern that is substantially colinear with the contact pins rather than away from the contact pins. As seen in FIG. 3B, the coupling trace 160 connects contact pin 22c to coupling pad 24c and coupling trace 170 connects contact pin 22e to coupling pad 24e. The coupling trace 160 includes interior portion 162 that is connected to coupling pad 24c, which are disposed on an interior layer(s) as discussed above. The coupling trace 160 also includes an in-contact via 164 that connects the contact pin 22c to the interior portion 162 of the coupling trace 160. Similarly, the coupling trace 170 includes interior portion 172 that is connected to coupling pad 24e, which are disposed on an interior layer(s) as discussed above. The coupling trace 170 also includes an in-contact via 174 that connects the contact pin 22e to the interior portion 172 of the coupling trace 170. As seen in FIG. 3B, unlike the embodiment of FIG. 3A, the coupling traces 160 and 170 do not have an outer portion that is routed on the same level as the contact pin and do not have inboard vias. Instead, the contact pins 22c and 22e are connected to the corresponding interior portions of the coupling traces 160 and 170, respectively, using vias 164 and 174 that go through the respective contact pins 22c and 22e. The in-contact vias 164 and 174 can be, for example, blind vias. In some embodiments, the in-contact vias can be polished and/or otherwise treated to minimize wear on the contact pins of the edge connector and/or socket.

In some embodiments, the in-contact vias 164 and 174 are formed near the distal end of the respective contact pins 22c and 22e such as, for example, near a beveled portion (not shown) of the edge connector 20. By using in-contact vias, the mutual inductance between the differential signal pair can be greater than the inboard trace configuration because the high-frequency signal current travels to the edge of the contact pin. Depending on factors such as, for example, coupling strength and/or facilitating the routing of the coupling traces, the interior portions of the coupling traces 160 and 170 can be formed on the same interior level(s) or different interior levels. In addition, depending on factors such as, for example, coupling strength and/or facilitating the routing of the coupling traces, the vias and/or the interior portions of the coupling traces 160 and 170 can be formed at a same distance or at different distances from the edge of the edge connector 20.

In some embodiments, one signal (Dt or Dc) of a differential signal pair Dtc can be configured with the coupling trace configuration of FIG. 3A while the other signal can be configured with the coupling trace configuration of FIG. 3B. In some embodiments, one or more differential signal pairs (e.g., Dtc1 signal) on a memory module can be configured with the coupling trace configuration of FIG. 3A while one or more differential signal pairs (e.g., Dtc7 signal) can be configured with the coupling trace configuration of FIG. 3B. In some embodiments, as shown in FIG. 3C one or more differential signal pairs Dtc can be configured with both the coupling trace configuration of FIG. 3A and the coupling trace configuration of FIG. 3B.

In the above embodiments, the area of the coupling pad that is colinear with the contact pin can be less than or equal to the area of the contact pin. A colinear area that is at 100% of the contact pin area provides the maximum capacitance. In some embodiments, the colinear area is in a range of 20% to 80% of the area of the contact pin. In some embodiments, the coupling pad is formed such that a portion of the coupling pad is not colinear with the contact pin (e.g., can extend beyond the contact pin as shown in FIGS. 3A to 3C). In some embodiments, a width of the coupling trace (e.g., see width w of coupling trace 60) can be less than or equal to the width of the coupling pad (e.g., see width W of coupling pad 24e). The length and/or width of the coupling trace and/or the length and/or width and/or the portion that is not colinear of the coupling pad can be set to tune the frequency behavior of the insertion loss notch when the edge connector is coupled to a socket. For example, depending on the type of memory device (e.g., DDR4, DDR5, DDIMM, etc.), embodiments of the present disclosure can be tuned to minimize the effects of insertion loss notch that can appear at 2 GHz or higher. For example, the length and/or width of the coupling trace and/or the length, width, and/or the portion that is not colinear of the coupling pad can be set to move the insertion loss notch to a different frequency that does not adversely affect the signals and/or have a lower quality notch.

Figure 4:
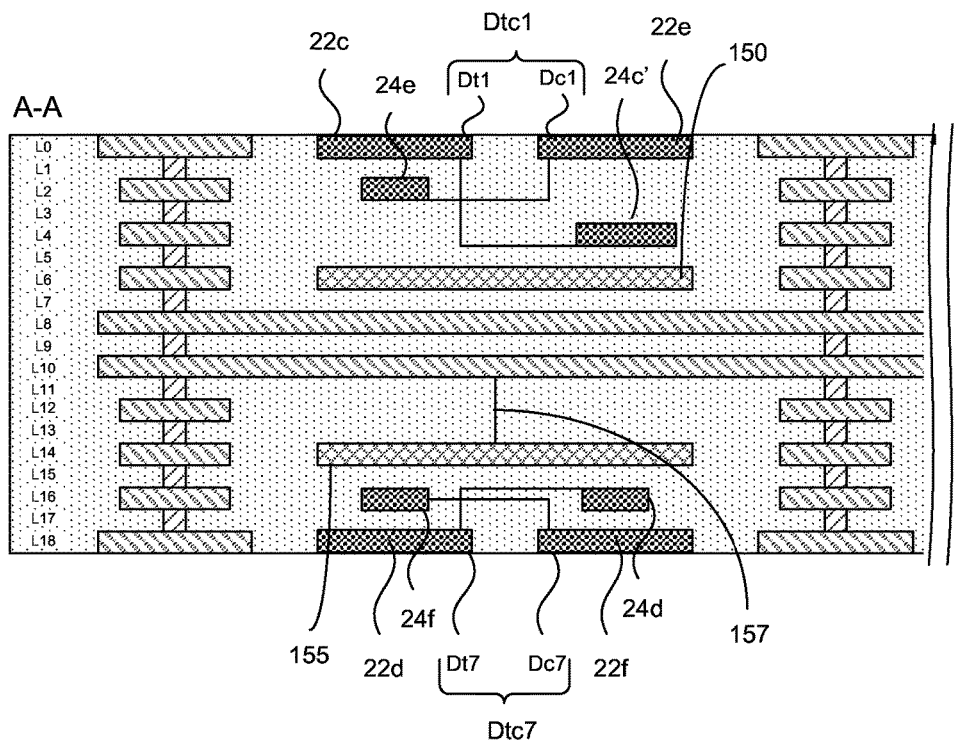
FIG. 4 illustrates a bottom cross-sectional view of another exemplary embodiment of edge connector configuration that is consistent with the present disclosure.

In some exemplary embodiments, the intra-pair coupling component of the edge connector 20 can include a conductive pad (e.g., formed by depositing conductive material) that is disposed between the contact pins 22 of the differential signal pairs Dtc at one or more interior layers to increase mutual capacitance between the contact pins. For example, as seen in FIG. 4, conductive pad 150 can be disposed between contact pads 22c and 22e corresponding to the Dtc1 signal at an interior layer(s) that is between the outer layer L0 and the ground trace 40a and/or conductive pad 155 can be disposed between contact pads 22c and 22e at an interior layer(s) that is between the outer layer L18 and the ground trace 40b. Each conductive pad 150, 155, when used, decreases the common mode coupling (capacitance to ground) for each differential signal pair Dtc1, Dtc7 and increases the intra-pair coupling (e.g., capacitance between Dt and Dc) for each differential signal pair. In some embodiments, at least a portion of the conductive pad can be colinear with the corresponding contact pins. In some embodiments, one or more conductive pads can be isolated from ground. For example, conductive pad 150 is surrounded by insulative material to electrically isolate the conductive pad 150 from ground. However, in some embodiments, the conductive pads can be resistively connected to ground to further provide tuning options. The resistive connection to ground can be achieved by setting the resistance of one or more interior layers between the conductive pad and ground trace at a predetermined value. The resistance of the layer can be set based on, for example, the materials that are used to form the layer and/or the dimensions (e.g., cross-sectional area and/or thickness) of the resistive layer. Alternatively, or in addition to the resistive layer(s), one or more resistive vias, which can be, for example, buried vias, and/or resistive traces can connect the conductive pad to ground. For example, as seen in FIG. 4, conductive pad 155 is connected to ground using a resistive via 157. The resistive via 157 can be set at a desired resistance value based on, for example, the type of material used to form the via and/or the dimensions (e.g., diameter) of the via. Any combination of isolated conductive pads and grounded conductive pads can be used. Similar to coupling pads, the length, width, a non-colinear portion, and/or resistance to ground (if any) of the conductive pad can be set to move the insertion loss notch to a different frequency that does not adversely affect the signals and/or have a lower quality notch.

In some embodiments, the intra-pair coupling component can include a conductive pad and one or both coupling pads (discussed above) disposed between the contact pins and the conductive pad to further enhance the intra-pair coupling. For example, as seen in FIG. 4, conductive pad 150 is formed on an interior layer that is below the interior layer coupling pad 24c' and conductive pad 155 is formed on an interior layer that is below the interior layer coupling pads 24d and 24f. The coupling pads can be formed on the same interior layer (e.g., coupling pads 24d and 24f) or different layers (e.g., coupling pads 24c' and 24e) as discussed above. In addition, the coupling trace configurations can be any of the configurations discussed above. The illustrations of the coupling traces 60, 70, 70', 80, 80', and 90, coupling pads 24c, 24c', 24d, 24f, and 24f', and conductive pads 150 and 155 in FIGS. 2A-2B 3A-C, and 4 and the corresponding descriptions are provided to teach the inventive concepts of the present technology. Based on these teachings, those skilled in the art will understand how to manufacture edge connectors with intra-pair coupling components that are consistent with the present disclosure. Accordingly, from the foregoing, those skilled in the art will understand that different features of the present technology can be combined as desired.

In general, it should be understood that various other devices and systems in addition to those specific embodiments disclosed herein may be within the scope of the present technology. For example, in the illustrated embodiments, the memory devices and systems are primarily described in the context of DIMMs compatible with DRAM. However, the present technology is compatible with other types of memory devices and systems which can include memory modules compatible with other types of storage media, including flash (e.g., NAND and/or NOR), PCM, RRAM, MRAM, read only memory (ROM), erasable programmable ROM (EPROM), electrically erasable programmable ROM (EEROM), ferroelectric, magnetoresistive, and other storage media, including static random-access memory (SRAM). Additionally, exemplary embodiments of the present technology are compatible with other types of electronic devices that experience insertion loss notch.

As used herein, the terms "vertical," "lateral," "upper," "lower," "above," and "below" can refer to relative directions or positions of features in the semiconductor devices in view of the orientation shown in the Figures. For example, "upper" or "uppermost" can refer to a feature positioned closer to the top of a page than another feature. These terms, however, should be construed broadly to include semiconductor devices having other orientations, such as inverted or inclined orientations where top/bottom, over/under, above/below, up/down, and left/right can be interchanged depending on the orientation.

As used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

From the foregoing, it will be appreciated that specific embodiments of the technology have been described herein for purposes of illustration, but that various modifications may be made without deviating from the disclosure. Accordingly, the invention is not limited except as by the appended claims. Furthermore, certain aspects of the new technology described in the context of particular embodiments may also be combined or eliminated in other embodiments. Moreover, although advantages associated with certain embodiments of the new technology have been described in the context of those embodiments, other embodiments may also exhibit such advantages and not all embodiments need necessarily exhibit such advantages to fall within the scope of the technology. Accordingly, the disclosure and associated technology can encompass other embodiments not expressly shown or described herein.

Numerous specific details are discussed to provide a thorough and enabling description of embodiments of the present technology. A person skilled in the art, however, will understand that the technology may have additional embodiments and that the technology may be practiced without several of the details of the embodiments described above with reference to the appended figures. In other instances, well-known structures or operations often associated with electronic devices (e.g., memory devices) are not shown, or are not described in detail, to avoid obscuring other aspects of the technology.

I claim:

1. An electronic device, comprising:
    a first contact pin disposed on a layer of an edge connector of the electronic device;
    a second contact pin disposed adjacent the first contact pin on a same layer as the first contact pin;
    a coupling pad disposed under the first contact pin;
    an interposing insulating layer disposed between the coupling pad and the first and second contact pins; and
    a coupling trace that electrically connects the coupling pad to the second contact pin.

2. The electronic device of claim 1, wherein at least a portion of the coupling pad is colinear with the first contact pin.

3. The electronic device of claim 1, wherein the first and second contact pins are configured to carry a differential signal pair.

4. The electronic device of claim 1, further comprising:
    a second coupling pad disposed under the second contact pin; and
    a second coupling trace that electrically connects the second coupling pad to the first contact pin.

5. The electronic device of claim 4, wherein the coupling pad, the second coupling pad, the coupling trace, and the second coupling trace are arranged to induce coupling of signals carried by the first and second contact pins.

6. The electronic device of claim 4, wherein the coupling pad is disposed colinear with the first contact pin, and the second coupling pad is disposed colinear with the second contact pin.

7. The electronic device of claim 4, wherein the coupling pad and the second coupling pad are disposed on a same layer under the respective first and second contact pins.

8. The electronic device of claim 4, wherein the coupling pad and the second coupling pad are disposed on different layers under the respective first and second contact pins.

9. The electronic device of claim 1, further comprising:
    a conductive pad, wherein at least a portion of the conductive pad is colinear with the first and second contact pins and is configured to induce coupling of signals carried by the first and second contact pins.

10. The electronic device of claim 9, wherein the conductive pad is electrically isolated from ground.

11. The electronic device of claim 9, wherein the conductive pad is resistively connected to ground.

12. The electronic device of claim 11, wherein the resistive connection includes resistive layers disposed between the conductive pad and the ground.

13. The electronic device of claim 11, wherein the resistive connection is a via connecting the conductive pad to the ground.

14. The electronic device of claim 1,
    wherein the edge connection is disposed on an end of a substrate of a printed circuit board of the electronic device,
    wherein the substrate has a plurality of layers and the first and second contact pins are disposed on an outer layer of the plurality of layers, and wherein at least one integrated circuit is disposed on the printed circuit board and electrically connected to the first and second contact pins.

15. A method, comprising:
transmitting a first signal on a first contact pin on an outer layer of a multi-layer printed circuit board;
transmitting a second signal on a second contact pin on the outer layer adjacent the first contact layer; and
intra-pair coupling the first signal and the second signal using a coupling pad disposed under the first contact pin on one or more interior layers of the multi-layer printed circuit board with an interposing insulating layer disposed between the coupling pad and the first and second contact pins.

16. The method of claim 15, wherein the coupling pad is aligned such that at least a portion of the coupling pad is colinear with the first contact pin, and
wherein the intra-pair coupling between the first signal and the second signal uses a coupling trace connecting the second contact pin to the coupling pad.

17. The method of claim 16, wherein the intra-pair coupling of the first signal and the second signal further includes using a second coupling pad disposed under the second contact pin on one or more second interior layers of the multi-layer printed circuit board and a second coupling trace connecting the first contact pin to the second coupling pad.

18. The method of claim 15, wherein the intra-pair coupling of the first signal and the second signal further includes using a conductive pad disposed at least partially colinear with the first and second contact pins and on an interior layer that is below the coupling pad.

19. The method of claim 18, wherein the conductive pad is isolated from ground.

20. The method of claim 18, wherein the conductive pad is resistively connected to ground.

* * * * *